United States Patent [19]

Thorn

[11] Patent Number: 4,968,947
[45] Date of Patent: Nov. 6, 1990

[54] APPARATUS FOR THE NON-DESTRUCTIVE MEASUREMENT OF THE OHMIC RESISTANCE OF THIN LAYERS

[75] Inventor: Gernot Thorn, Hanau, Fed. Rep. of Germany

[73] Assignee: Leybold Aktiengesellschaft, Hanau, Fed. Rep. of Germany

[21] Appl. No.: 345,036

[22] Filed: Apr. 27, 1989

[30] Foreign Application Priority Data

Apr. 30, 1988 [DE] Fed. Rep. of Germany ....... 3815011

[51] Int. Cl.$^5$ ............................................. G01R 27/02
[52] U.S. Cl. .................................... 324/701; 324/709; 324/720
[58] Field of Search ...................... 324/61 R, 62, 61 P, 324/709, 708, 691, 701, 720, 693, 695, 690

[56] References Cited

U.S. PATENT DOCUMENTS

| | | | |
|---|---|---|---|
| 3,723,885 | 3/1973 | Urmenyi | 324/61 R |
| 4,208,624 | 5/1980 | Miller | 324/60 C |
| 4,208,625 | 5/1980 | Piso | 324/61 R |
| 4,290,008 | 9/1981 | Hoshino et al. | 324/61 R |
| 4,569,445 | 2/1986 | Kovats et al. | 324/61 R |
| 4,682,105 | 7/1987 | Thorn | 73/159 |

FOREIGN PATENT DOCUMENTS

| | | |
|---|---|---|
| 3335766 | 4/1985 | Fed. Rep. of Germany . |
| 3443967 | 6/1986 | Fed. Rep. of Germany . |
| 3720160 | 12/1987 | Fed. Rep. of Germany . |
| 2020044 | 11/1979 | United Kingdom . |
| 2147423 | 10/1983 | United Kingdom . |
| 2158255 | 5/1984 | United Kingdom . |

Primary Examiner—Reinhard J. Eisenzopf
Assistant Examiner—Maura K. Regan
Attorney, Agent, or Firm—Koda & Androlia

[57] ABSTRACT

The invention concerns apparatus for the non-destructive measurement of the ohmic resistance of thin layers. The apparatus is based on a capacitative measurement process wherein the plates of a capacitor are formed by an electrode (3) with the thin layer (6) to be measured, the dielectric of the capacitor being constituted by a carrier foil (5) on which the thin layer (6) is carried, for instance by means of a vacuum-depositing process. The electrode (3) is supplied via an oscillator with high-frequency voltage ($U_{HF}$) so that a displacement current flows from the electrode (3) over the carrier foil (5) to the thin layer (6) and from there back again. This displacement current is composed of an ohmic part and a capacitive part. In order to maintain the capacitative part constant even for fluctuating capacitances, caused e.g. by changes in the thickness of the carrier foil (5), an additional capacitor is connected in a regulated manner to the capacitor that is present.

16 Claims, 6 Drawing Sheets

APPARATUS FOR THE NON-DESTRUCTIVE MEASUREMENT OF THE OHMIC RESISTANCE OF THIN LAYERS

The invention concerns apparatus according to the preamble of claim 1.

In the measurement of the properties of thin layers the problem arises that these layers may be damaged or destroyed in the measurement process by being touched or contacted. It is particularly disturbing when during measurement of the electrical resistance of a thin layer this layer is pressed through, scratched or contaminated.

To avoid these disadvantages several measurement processes have already been developed using sensors operating in a contactless manner. Thus e.g. from German Utility Model No. 68.10362 an apparatus is known for measuring the layer thickness of a metallic coating on an insulating web wherein the conductivity of this coating is measured without mechanical contacting. In this apparatus rotatable rollers serve to guide the web of insulating material and simultaneously to measure the conductivity of its metallic coating, the rollers functioning as capacitor plates for the capacitative coupling of an ohmmeter. Thus one is concerned with a contactless, capacitative measurement process.

Figure 3:
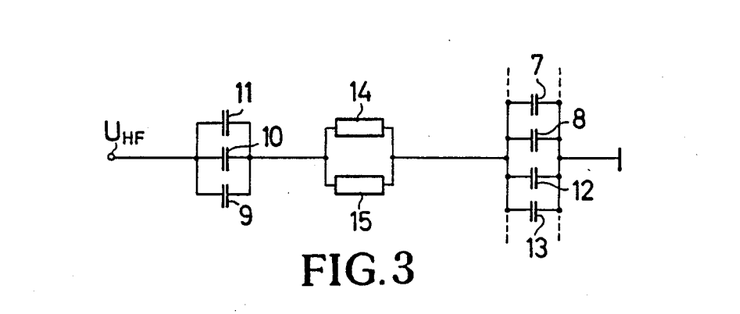
FIG. 3 is an equivalent circuit diagram to the representation in principle according to FIG. 1.

In a further known capacitive measurement process, a guide roller and several sensors with locally limited measurement ranges are used for the electrical measurement of layer thicknesses on running strips in vacuum coating plants (German Published Application No. 33 35 766, FIG. 3). Here the sensors are in a distributed arrangement over the surface of the guide roller and connected via a transmitter to an analysing circuit. In addition, all the sensors are connected with a common oscillator which produces a displacement current between an electrode and one of the thin layers to be measured.

Furthermore, a process is known for testing electrical components by means of current and/or voltage measurement wherein an alternating voltage finds use as the test signal the current of which through the test object raised slowly to a predetermined value (German Published Application No. 34 43 967). Here the voltage drop across the test object and/or its phase relative to the current and/or the relationship of one of each half-wave voltage or current for the determination of the test object. This known process, in which the emphasis is on the amplitude change of an alternating voltage is not provided for a measurement of thin layers which cause capacitive changes. Furthermore, no feedback of an actual phase shift to a desired phase shift occurs.

In another known process for the investigation of dielectric semi-conductor materials a probe is brought between two electrodes and exposed to a sinusoidal high frequency. Simultaneously the probe is subjected to a perturbing influence such as for instance, by thermal, optical or particle radiation (U.S. Pat. Specification No. 4 208 624). Then the admittance is determined from the current-voltage relationship. Insofar as a resonant circuit is formed by the probe as capacitor and a suitable inductor and the per turbance is pulsed synchronously with the resonant oscillation, the signal-to-noise ratio in the output signal is improved. However, no regulation of the phase-shift to a predetermined phase-shift value occurs.

Finally, an apparatus is also known from measurements at shaped bodies made of non-metallic materials, wherein a shaped body of non-metallic material is set between a metal and a measuring probe which produces an alternating magnetic field (German Published Application No. 37 20 160). Here the energy loss of the alternating magnetic field is measured, which is dependent on the thickness of the shaped body of non-metallic material. However, this apparatus has no oscillator with an alternating electric field.

The underlying task of the invention is to provide an apparatus for the contactless capacitative measurement of layer resistance which can make do without expensive analysing circuits and makes it possible to compensate for fluctuations in capacitance.

This task is solved according to the features of claim 1.

The advantage achieved by the invention consists particularly in that it is possible contactlessly to measure extremely high-impedance thin layers on plastics carrier foils directly during their manufacture in plants for vacuum-coating strip material and by process control to produce such layers within narrow tolerance limits of resistance. In addition, the capacitative measuring device may be used together with an inductive measuring device, whereby the same electronic analysing circuitry may be used for both measuring devices. The use of the same analysing electronics becomes possible where the inductive measuring device utilises an oscillating circuit which is tuned to resonance at all times and contains the measuring inductor. In this case, both in the capacitative and in the inductive measuring device currents flow which are essentially determined by the ohmic resistance of the thin layer to be measured. These currents may be processed by a single circuit arrangement. With the aid of a phase-shift circuit in the case of the inductive measuring device the oscillating circuit is balanced to resonance in the while in the case of the capacitative measuring device the phase angle is held to a constant value. By holding the phase angle to a constant value it is possible to eliminate the capacitative influences of foils onto which the layer to be measured is vapour-coated. Should, for instance, the capacitance between the electrode and the thin layer change because as the foil rotates it becomes thinner or for other reasons suddenly becomes thicker, then the capacitative part of the current flowing into the electrode also changes. This part may, however, be held constant when at all times such a capacitor is connected to the actual capacitor between the electrode and the thin layer as will maintain a predetermined capacitance value.

A preferred embodiment of the invention is illustrated in the drawings and will be described in greater detail below. In the drawings.

Figure 1:
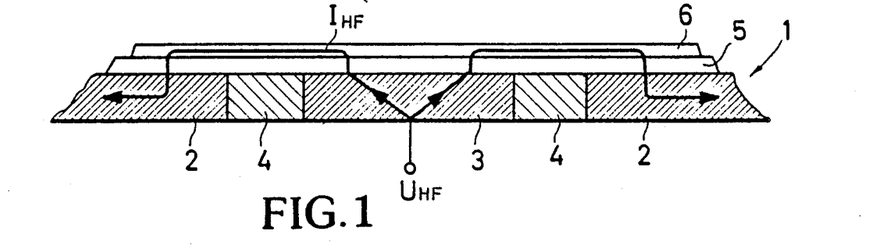
FIG. 1 is a representation of the principle of a capacitative sensor.

In FIG. 1 the principle of a capacitative sensor for the measurement of the electrical resistance of a thin layer is illustrated. Here 1 designates a roller body into the surface 2 of which an electrode is integrated. Electrical insulation 4 is disposed between the surface 2 and the electrode 3 to prevent a direct flow of current between the surface 2 and the electrode 3. An insulating carrier foil 5 on which the layer 6 to be measured is disposed lies on the surface 2 and the electrode 3.

The electrode 3 is connected to a high-frequency alternating voltage $U_{HF}$ which oscillates, for example, at a frequency of 2 MH$_z$. The displacement current $I_{HF}$ produced by this voltage $U_{HF}$ flows from the electrode through the carrier foil 5 to the layer 6 and from there via the carrier foil 5 to the surface 2.

Figure 2:
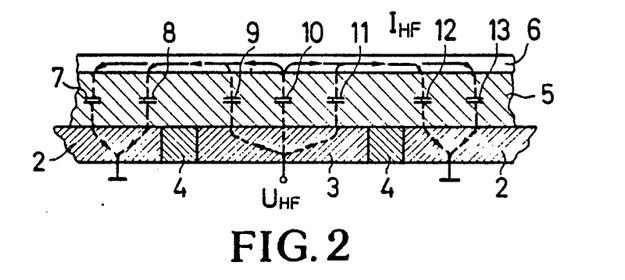
FIG. 2 is a further representation of the principle of the capacitative sensor.

The foil 5 is, so to speak, the dielectric between capacitor plates which are disposed between the layer 6 and the surface 2 or the electrode 3. FIG. 2 shows this clearly wherein several capacitors 7 to 13 are illustrated between the layer 6 and the roller body 2 or the electrode 3. These capacitors 7 to 13 represent the actual partial capacitances between the layer 6 and the electrode 3 or roller body 2. When the electrical properties and/or the thickness of the foil 5 change, the capacitances of the capacitors 7 to 13 also change and with them changes the capacitive portion of the current $I_{HF}$. The task of the invention is to eliminate the influence of these capacitance fluctuations.

An electrical equivalent circuit of the arrangement according to FIG. 2 is shown in FIG. 3. It may be seen that the capacitors 7, 8, 12, and 13 and 9, 10 and 11 are connected in parallel and both parallel circuits are connected via resistors 14, 15 which are in turn also connected in parallel with each other. These resistors 14, 15 represent the instantaneous ohmic resistance between the electrode 3 and the roller body 2, which latter is grounded (earthed). For a carrier foil 5 having always the same resistance values the values of the resistances are determined essentially by the surface(area) resistance of the layer 6. In the measurement range the insulating carrier foil 5 is practically loss-free and functions as a capacitor dielectric. The ohmic resistance which is here measured and for the geometry that is used here by:

$$R \sim \frac{1}{20} R_\square$$

that is, 20 M $\Omega_\square$ are transformed in a more easily measurable value $R_{17}$ of 1 M$\Omega$. It is advantageous to step down very high-impedance layer resistances in this way while for an inductive sensor it was favourable to step $R_\square$ up by a factor of 11,000.

Figure 4:
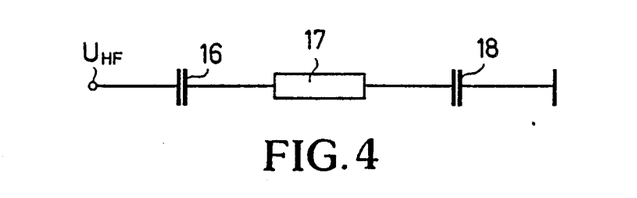
FIG. 4 is a simplified electrical equivalent circuit diagram.

The capacitors 7, 8, 12, 13, the resistors 14, 15 and the capacitors 9, 10 and 11 may be combined together in the equivalent circuit diagram so that the simplified equivalent circuit diagram according to FIG. 4 results. In this equivalent circuit diagram only one capacitor 16, one resistor 17 and a further capacitor 18 are present which are always connected in series.

Figure 5:
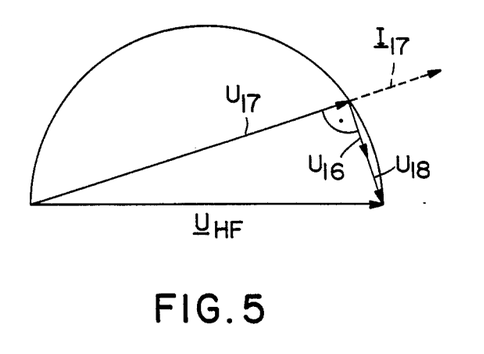
FIG. 5 is a vector diagram for illustrating the capacitative measuring principle.

The vector diagram utilisable for the equivalent circuit diagram according to FIG. 4 is shown in FIG. 5. Here the total voltage $U_{HF}$ is made up of a real part $U_{17}$ and an imaginary part $U_{16}+U_{18}$, and the current flowing through the resistor is designated by $I_{17}$. The operating principle of the arrangement according to FIGS. 1 to 4 is thus as follows: the applied constant high frequency voltage $U_{HF}$ drives the current $I_{17}$ through the series connection consisting of the capacitor 16, the resistor 17 and the capacitor 18. The magnitude of this current, which is proportional to the conductance of the layer 6 that it flows through, may readily be measured by means of a shunt.

Since the arrangement according to FIGS. 1 to 4 has no resonance characteristic, a frequency correction is not required. However, an automatic compensating arrangement may nevertheless be used to compensate for fluctuations in the thickness or dielectric constants of the carrier foil 5. This automatic compensating arrangement is always present when an inductive sensor having an oscillating circuit tuned to resonance is also used.

Figure 6:
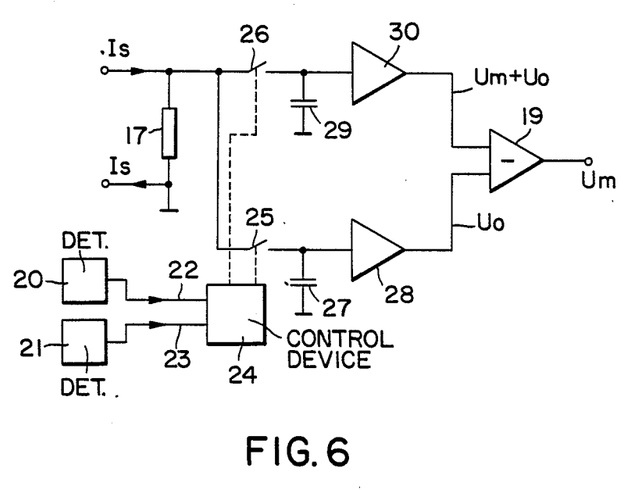
FIG. 6 is a block diagram of a zero-compensating circuit

Compensation for zero drift is undertaken by forming a difference between the measurement of the object and the measurement of zero. FIG. 6 shows in detail how this occurs. In a differential amplifier 19 a constantly repeated difference formation is undertaken between a superimposed measurement signal $U_m+U_O$ and a zero signal $U_O$ so that at the output of the differential amplifier 19 the non-superimposed measuring signal $U_m$ arises.

Two position signals 22, 23 are produced by position detectors 20, 21 e.g. reflected light barriers or proximity switches. One position signal 22 indicates when no carrier foil lies next to the sensor does not lie is not on carrier foil (=zero signal), while the other position signal 23 indicates when the sensor is on the carrier foil 5. A control device 24 is so operated by means of these position signals 22, 23 that it closes or opens switches 25, 26. Should no sensor be on the foil 5 then the switch 25 is closed by the position signal 23. The voltage value then arising at the resistor 17 is fed to a storing and holding circuit 27, 28 and stored there. In contrast, if the sensor lies on the foil 5, then the switch 25 is opened by the position signal 22 and the switch 26 is closed, i.e. now the actual measurement value with the zero signal are stored in the storing and holding circuit 29, 30.

Figure 10:
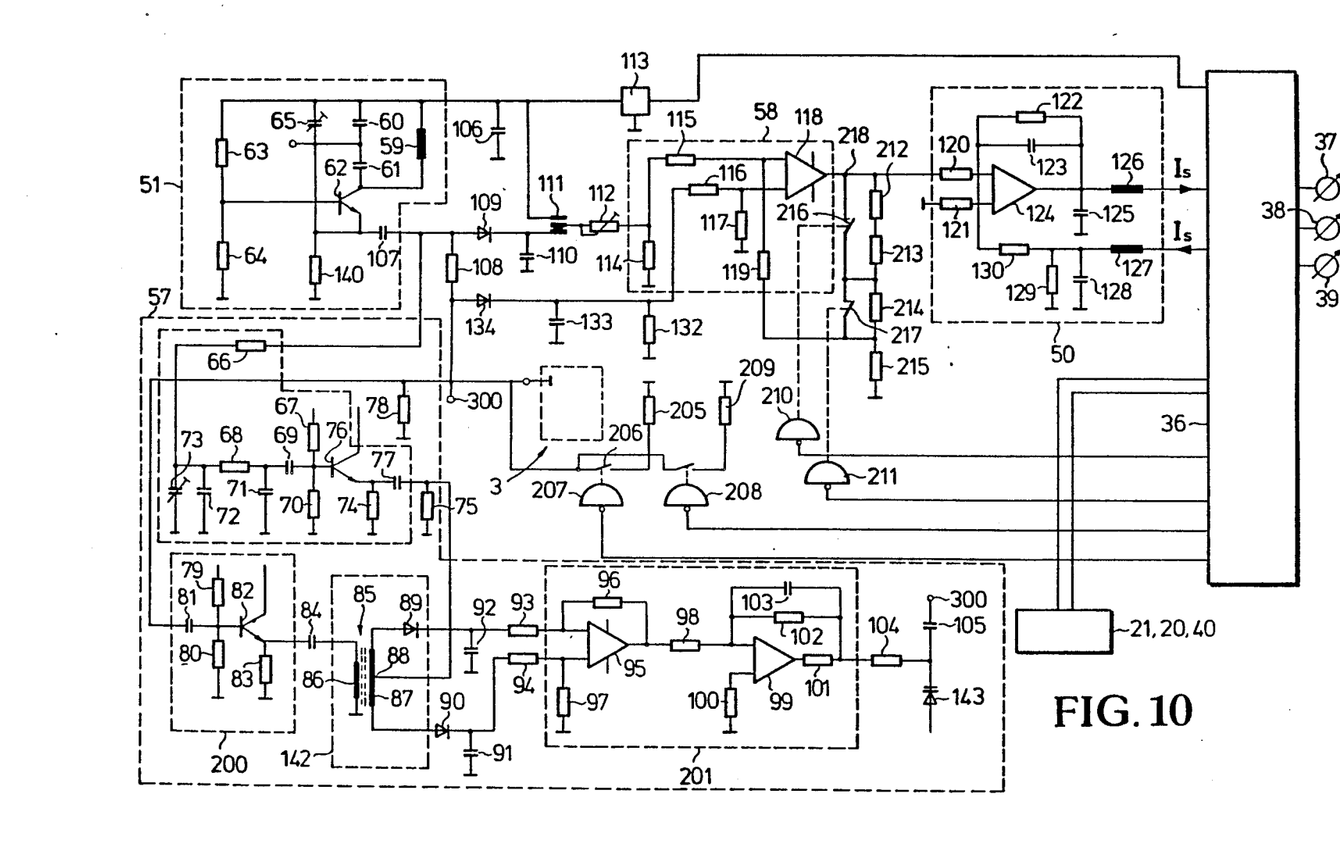
FIG. 10 is a detailed representation of the block diagram according to FIG. 1.

The output signals of the storing and holding circuits 27, 28 and 29, 30, respectively, are subtracted from each other in a comparator 19 so that the actual measurement signal is available at the output. In this way any drift phenomena that arise are compensated and the output signal $U_m$ is dependent only on the conductivity of the object being measured. To set the measurement range this output signal $U_m$ may be suitably amplified. The storing and holding circuit 27, 28; 29, 30 as well as the comparator 19 are disposed in a signal analysing device 36 which will be further described below (FIG. 10).

By evaluating the signals of several sensors which are, for instance, arranged over the width of a roller, the cross-sectional profile of the conductivity may be represented. After forming a mean value of all the signals and a comparison with an adjustable desired value, it is possible to output the deviation of the desired value from the actual value for monitoring tolerances. This value is also suited for carrying out a regulation to constant conductivity or to constant surface resistance, in that one brings an influence to bear on the source of evaporation or the velocity of the foil.

With the invention described, a surface resistance of preferably between 100 kilohm and 100 megohm be measured.

Figure 7:
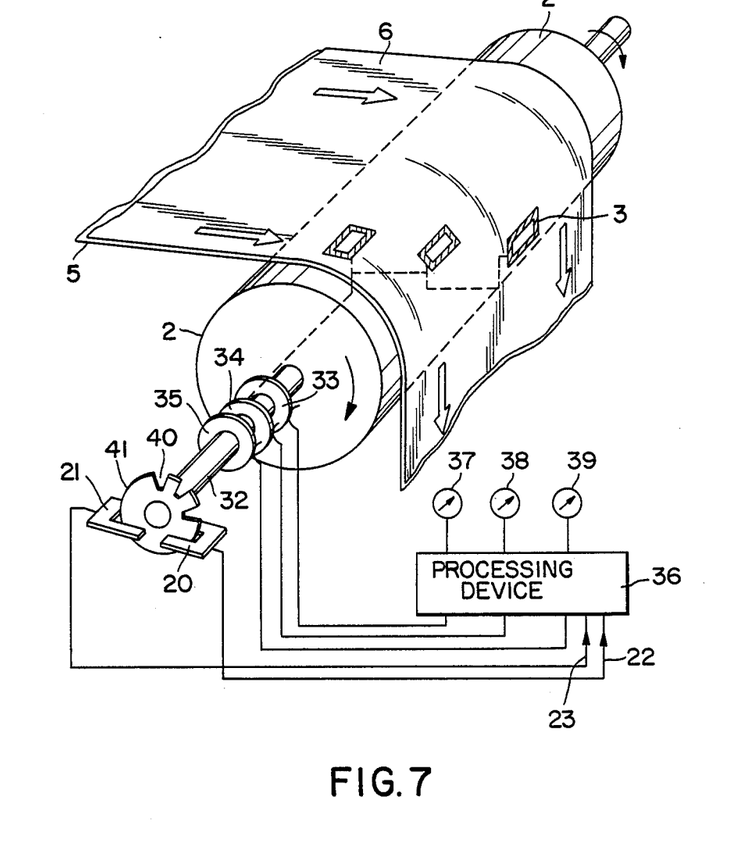
FIG. 7 is an arrangement of capacitative sensors on a roller.

FIG. 7 shows how the essential elements of the arrangement according to FIGS. 1 to 6 may be accommodated in an apparatus which includes a roller body 2 over which rolls the layer 6 to be measured. The electrodes 3 and the associated electronic components are embedded into the surface of the roller body 2. Since the layer 6 is transported on the carrier foil 5 over this roller 2 it is ensured that for each revolution of the roller 2 the sensor emits one zero signal and does so moreover when there is no layer 6 on the electrode 3. In contrast, when there is a layer 6 on the electrode 3, a measurement signal is emitted.

The pick-off of the measurement values from the roller 2 ensues via slip rings 33, 34, 35 seated on a shaft 32. The voltages picked off are fed to a processing device 36 and are displayed by display devices 37, 38, 39. Position detectors 20, 21 mounted on the roller 2 are effective to switch the zero signal and the measurement signal to the stores 29, 30 and 27, 28, respectively, in the analysing circuit according to FIG. 6. Commercially available inductive, capacitative or optical detectors 20, 21 may be used, with a disc 41 provided with cutouts 40 rotating through them. The difference between these two signals is a voltage which is dependent only on the properties of the layer 6 and is inversely proportional to the layer resistance.

For each sensor the analysing electronics contains a circuit arrangement according to FIG. 6 in which in turn a logic circuit 24 operates the switches 25, 26 corresponding to the angular position of the roller 2. The output signal $U_m$ is fed to the display devices 37 or 38 or 39.

Figure 8:
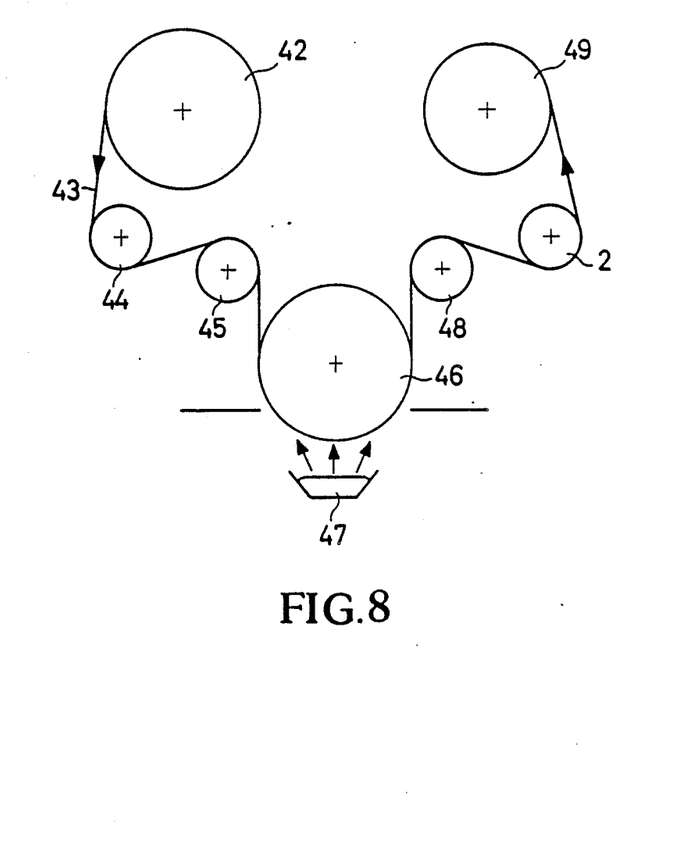
FIG. 8 illustrates the use of a roller according to FIG. 7 in a coating plant.

FIG. 8 represents the principle of a coating plant in which the roller 2 is used. A carrier foil 43 runs from a pay-out roller 42 over guide rollers 44, 45 to a conductive roller 46 which selects the strip velocity in the process. With the aid of an evaporation source 47 the coating of the foil 43 takes place here and given after passing a further guide roller 48 the coated foil 43 is fed to the measuring roller 2 from where the coated foil 43 reaches a further roller 49 where it is coiled up.

Figure 9:
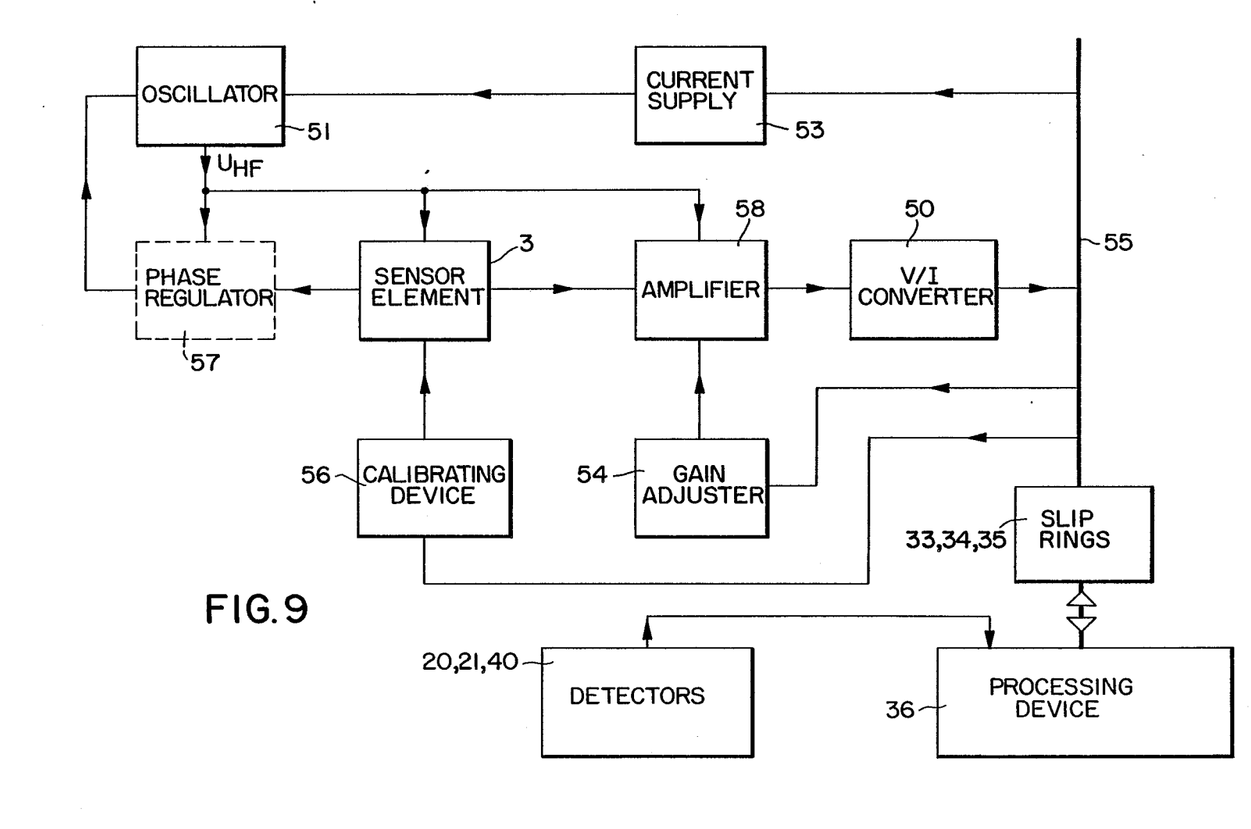
FIG. 9 is a block diagram of a capacitative sensor.

FIG. 9 is a block diagram of the circuit arrangement showing the connections of the electrode 3. The voltage $U_{HF}$ applied to the electrode 3 is here produced by an oscillator 51 which in turn is connected to a current supply 53. The output signal of the sensor element 3 is amplified by an amplifier 58 and is converted to a current by a voltage-to-current converter 50. The gain may be adjusted by means of a gain adjuster 54. The current supply 53, the voltage-to-current converter 50 and the gain adjuster 54 are all connected to a bus 55 connected with a slip ring transmitter 33, 34, 35 which in turn is connected with electronic analysing circuitry 36.

In addition, a calibrating device 56 is connected to the bus 55 and is connected with the sensor element 3. A phase-regulating device 57 is illustrated in broken lines between the sensor element 3 and the oscillator 51. This phase-regulating device 57 is required to keep the capacitative part of the current induced by the oscillator 51 at a constant value.

A detailed representation of the arrangement according to FIG. 9 is shown in FIG. 10. The oscillator 51 contains a inductor 59 to which two capacitors 60, 61 are connected in parallel while a transistor 62 is connected in series with the capacitors 60, 61 and the coil 59. A trimming capacitor 65 is connected in parallel to the capacitor 60 and is also connected with the resistor 140 and the emitter of the transistor 62. The base of this transistor 62 is coupled to a voltage divider having two resistors 63, 64.

The output of the oscillator 51 is connected to a regulating circuit 57 which contains a phase shifter having components 66 to 77, a preamplifier 200 with elements 79 to 83, a rectifier-transformer 142 with elements 85 to 92, a two-stage amplifier 201 with elements 95 to 103 and a variable capacitance diode (varactor) 143 connected with a capacitor 105 and a resistor 104. The terminal 300 at the capacitor 105 is connected with the capacitative sensor 3. The regulating circuit 57 enables the fluctuations in capacitance of the sensor-capacitor to be compensated.

The sensor element 3 is connected with the preamplifier 200 of the phase-regulating device 57, the preamplifier containing a transistor 82 equipped with three resistors 79, 80, 83 and the capacitor 81. The output signal of this preamplifier 200 is fed via a capacitor 84 to the primary winding 86 of a transformer 85 the secondary 87 of which has a central tap 88. A connection from this central tap 88 leads to the resistor 75 and to the phase shifter. The total voltage at the secondary 87 is fed via resistors 93, 94 to the first stage of the two-stage amplifier 201 which consists of an operational amplifier 95 provided with resistors 96, 97. The output voltage of the operational amplifier 95 is then passed via a resistor 98 to one input of a second operational amplifier 99 the second input of which is grounded via resistor 100. The feedback loop of this operational amplifier contains a parallel circuit consisting of a capacitor 103 and a resistor 102. The output signal of the operational amplifier 99 is passed via a resistor 104 to the cathode of the varactor diode 143 as well as to the capacitor 105. The terminal 300 of the capacitor 105 is connected with the corresponding terminal 300 of oscillator 51.

The voltage applied to resistor 108, which is proportional to the current flowing in the sensor element 3 is fed via diodes 109, 134 and resistors 112, 115 and 116 to an amplifier 118 which proportionally amplifies the applied voltage. The output voltage of the amplifier 118 may be altered by remote control through switching in and disconnecting various resistors 212 to 214. By means of the analysing circuit, which is disposed in a control cabinet and is thus accessible at all times, one may adjust the gain of the sensor located in vacuum in a stepwise manner until matching to the measurement range is achieved. In addition, it is possible to actuate the switches 207, 208 and thereby to connect calibrating resistors parallel to the sensor element.

The voltage amplified by the amplifier 118 is passed to the voltage-to-current converter 50 which controls or actuates the analysing device 36 and the display devices 37, 38, 39 via inductors 126, 127.

I claim:

1. An apparatus for non-destructive measurement of the ohmic resistance of thin layers comprising:
    an electrode (3) being connected to a constant high frequency alternating voltage ($U_{HF}$);
    a thin layer (6) the ohmic resistance of which is to be measured, said layer having a predetermined distance to said electrode (3);
    an element (2) having a predetermined distance to said layer (6) and being electrically separated from said electrode (3), said element (2) being connected such that a current ($I_{HF}$) can flow from said electrode (3) via said layer (6) to said element (2); and non-ohmic resistances being controllably connected to the pathway of the current ($I_{HF}$) so as to eliminate the influence of non-ohmic resistances on a predetermined non-ohmic resistance.

2. Apparatus according to claim 1, characterised in that the alternating voltage ($U_{HF}$) has a frequency of 2 MHz.

3. Apparatus according to claim 1, characterised in that a carrier foil (5) is disposed between the layer (6) to be measured and the electrode (3).

4. Apparatus according to claim 1, characterised in that the sensor is built into a strip guiding roller (2) of a strip vapour coating apparatus.

5. Apparatus according to claim 4, characterised in that the output current of the sensor is picked off by slip rings (33, 34, 35) and passed to an analysing device (36).

6. Apparatus according to claim 1, characterised in that position detectors (20, 21) are provided to determine whether a thin layer (6) to be measured is in the proximity of the electrode (3) of the sensor.

7. Apparatus according to claim 6, characterised in that the position detector is a reflecting light barrier.

8. Apparatus according to claim 6, characterised in that the position detector is a proximity switch.

9. Apparatus according to claim 1, characterised in that measurement signals and zero signals are detected.

10. Apparatus according to claim 9, characterised in that the difference between the measurement signal and the zero signal is formed.

11. Apparatus according to claim 10, characterised in that several sensors are arranged over the width of the roller (2) and the signals of these sensors are evaluated to determine the cross-sectional profile of the conductivity of the layer to be measured.

12. Apparatus according to claim 11, characterised in that the mean value of the output signal of the sensors is formed and compared with a desired value and that regulation to this desired value takes place.

13. Apparatus according to claim 1, characterised in that the arrangement has a phase shift circuit (57).

14. Apparatus according to claim 13, characterised in that the phase shift circuit has a 90° phase-shifter, a preamplifier (200) a rectifier-transformer (142) a two-stage amplifier (201) and a variable capacitance diode (143).

15. Apparatus according to claim 13, characterised in that the phase shift circuit is also us for the resonance tuning of an oscillating circuit containing an inductor provided for the inductive detection of the surface resistance of a thin layer.

16. Apparatus according to claim 1, characterised in that when using several sensors each sensor has its own oscillator (51), its own initial processing electronics, its own step-wise remotely controllable amplifier (58) and its own remotely controllable calibrating device with at least one calibrating resistance.

* * * * *